United States Patent
Daniels et al.

(10) Patent No.: US 9,455,216 B2
(45) Date of Patent: *Sep. 27, 2016

(54) SEMICONDUCTOR DEVICE PACKAGE AND METHOD OF MANUFACTURE

(71) Applicant: Freescale Semiconductor, Inc., Austin, TX (US)

(72) Inventors: Dwight L. Daniels, Phoenix, AZ (US); Stephen R. Hooper, Mesa, AZ (US); Alan J. Magnus, Gilbert, AZ (US); Justin E. Poarch, Gilbert, AZ (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/696,917

(22) Filed: Apr. 27, 2015

(65) Prior Publication Data

US 2015/0228560 A1 Aug. 13, 2015

Related U.S. Application Data

(60) Division of application No. 14/453,902, filed on Aug. 7, 2014, now Pat. No. 9,093,436, which is a continuation of application No. 13/537,392, filed on Jun. 29, 2012, now Pat. No. 8,841,758.

(51) Int. Cl.
*H01L 23/495* (2006.01)
*H01L 23/00* (2006.01)
(Continued)

(52) U.S. Cl.
CPC ..... *H01L 23/49537* (2013.01); *H01L 21/4842* (2013.01); *H01L 23/3114* (2013.01);
(Continued)

(58) Field of Classification Search
CPC .................................................. H01L 23/49537
USPC ........................................................ 257/666
See application file for complete search history.

(56) References Cited

U.S. PATENT DOCUMENTS

| 4,920,074 A | 4/1990 | Shimizu et al. |
| 5,391,439 A | 2/1995 | Tomita et al. |

(Continued)

FOREIGN PATENT DOCUMENTS

| JP | 62-9639 | 1/1987 |
| JP | 2000223643 A | 8/2000 |

(Continued)

OTHER PUBLICATIONS

Thomas Koschmieder et al., "Soldering the QFN Stacked Die Sensors to a PC Board", Application Note AN1902 Rev 5, Apr. 2010, 9 pages, Freescale Semiconductor, Inc., US.

(Continued)

*Primary Examiner* — Anthony Ho
(74) *Attorney, Agent, or Firm* — Sherry W. Schumm

(57) ABSTRACT

A structure to improve saw singulation quality and wettability of integrated circuit packages (140) is assembled with lead frames (112) having half-etched recesses (134) in leads. In one embodiment, the structure is a lead frame strip (110) having a plurality of lead frames. Each of the lead frames includes a depression (130) that is at least partially filled with a material (400) prior to singulating the lead frame strip. In another embodiment, the structure is a semiconductor device package (140) that includes a semiconductor device encapsulated in a package body (142) having a plurality of leads (120). Each lead has an exposed portion external to the package. There is recess (134) at a corner of each lead. Each recess has a generally concave configuration. Each recess is filled with a removable material (300).

20 Claims, 10 Drawing Sheets

(51) Int. Cl.
  *H01L 21/48* (2006.01)
  *H01L 23/31* (2006.01)
(52) U.S. Cl.
  CPC ... *H01L23/49541* (2013.01); *H01L 23/49548* (2013.01); *H01L 23/49558* (2013.01); *H01L 23/49586* (2013.01); *H01L 24/97* (2013.01); *H01L 23/3107* (2013.01); *H01L 2924/181* (2013.01); *Y10T 29/49121* (2015.01)

(56) References Cited

U.S. PATENT DOCUMENTS

| | | | |
|---|---|---|---|
| 5,444,293 A | 8/1995 | Li |
| 5,519,251 A | 5/1996 | Sato et al. |
| 5,804,880 A | 9/1998 | Mathew |
| 6,060,768 A | 5/2000 | Hayashida et al. |
| 6,201,292 B1 | 3/2001 | Yagi et al. |
| 6,238,952 B1 | 5/2001 | Lin |
| 6,261,864 B1 | 7/2001 | Jung et al. |
| 6,306,685 B1 | 10/2001 | Liu et al. |
| 6,333,252 B1 | 12/2001 | Jung et al. |
| 6,342,730 B1 | 1/2002 | Jung et al. |
| 6,400,004 B1 | 6/2002 | Fan et al. |
| 6,420,779 B1 | 7/2002 | Sharma et al. |
| 6,452,255 B1 | 9/2002 | Bayan et al. |
| 6,495,909 B2 | 12/2002 | Jung et al. |
| 6,528,893 B2 | 3/2003 | Jung et al. |
| 6,608,366 B1 | 8/2003 | Fogelson et al. |
| 6,700,188 B2 | 3/2004 | Lin |
| 6,723,585 B1 | 4/2004 | Tu et al. |
| 6,744,118 B2 | 6/2004 | Ikenaga et al. |
| 6,861,295 B2 | 3/2005 | Jung et al. |
| 6,872,599 B1 | 3/2005 | Li et al. |
| 7,023,074 B2 | 4/2006 | Li et al. |
| 7,033,866 B2 | 4/2006 | Chow et al. |
| 7,081,666 B2 | 7/2006 | Joshi et al. |
| 7,105,383 B2 | 9/2006 | Vo et al. |
| 7,183,630 B1 | 2/2007 | Fogelson et al. |
| 7,348,269 B2 | 3/2008 | Tanaka et al. |
| 7,382,045 B2 | 6/2008 | Osako et al. |
| 7,397,112 B2 | 7/2008 | Sato et al. |
| 7,402,459 B2 | 7/2008 | Xiaochun et al. |
| 7,405,104 B2 | 7/2008 | Minamio et al. |
| 7,405,106 B2 | 7/2008 | Maloney et al. |
| 7,405,945 B2 | 7/2008 | Miura |
| 7,410,834 B2 | 8/2008 | Fukaya et al. |
| 7,413,934 B2 | 8/2008 | Tellkamp |
| 7,423,337 B1 | 9/2008 | Patwardhan et al. |
| 7,456,049 B2 | 11/2008 | Miyata |
| 7,458,054 B2 | 11/2008 | Hara |
| 7,462,870 B2 | 12/2008 | Nakashima |
| 7,489,026 B2 | 2/2009 | Wang et al. |
| 7,960,816 B2 | 6/2011 | Chow et al. |
| 8,017,447 B1 | 9/2011 | Olsen |
| 8,115,299 B2 | 2/2012 | Kasuya et al. |
| 8,330,270 B1 | 12/2012 | Lin et al. |
| 8,501,539 B2 | 8/2013 | Hess et al. |
| 8,841,758 B2 * | 9/2014 | Daniels .................. H01L 24/97 257/676 |
| 2005/0067676 A1 | 3/2005 | Mahadevan et al. |
| 2005/0116321 A1 | 6/2005 | Li et al. |
| 2009/0236713 A1 | 9/2009 | Xu et al. |
| 2010/0013069 A1 | 1/2010 | Kasuya et al. |
| 2010/0133693 A1 | 6/2010 | Arshad |
| 2011/0108965 A1 | 5/2011 | Hess et al. |
| 2011/0244629 A1 | 10/2011 | Gong et al. |
| 2011/0263077 A1 | 10/2011 | Bai et al. |
| 2013/0049180 A1 | 2/2013 | Xu et al. |

FOREIGN PATENT DOCUMENTS

| | | |
|---|---|---|
| JP | 2007-214185 | 8/2007 |
| WO | 2009/125250 A1 | 10/2009 |

OTHER PUBLICATIONS

Extended European Search Report for Patent Appln. No. 15172276.6 (Jan. 28, 2016).
Extended European Search Report for Patent Appln. No. 13173268.7 (Nov. 17, 2014).

* cited by examiner

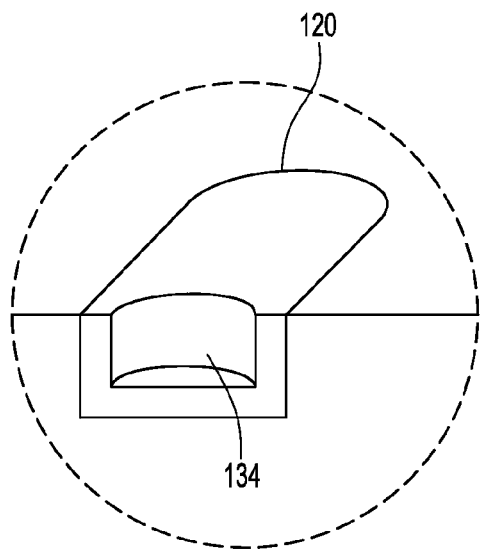
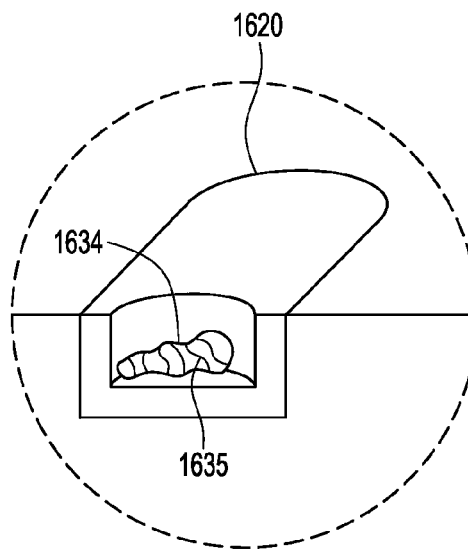
FIG. 15
FIG. 16
- PRIOR ART -
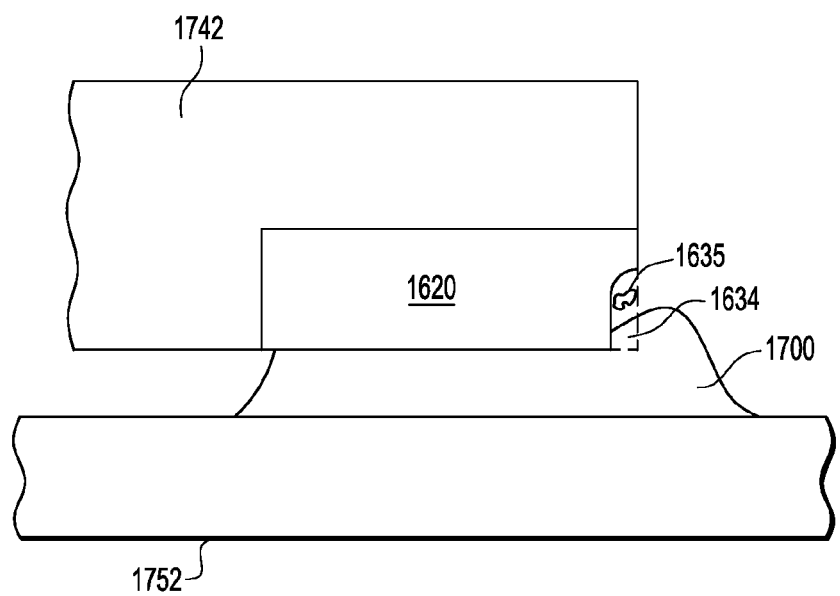
FIG. 17
- PRIOR ART -

SEMICONDUCTOR DEVICE PACKAGE AND METHOD OF MANUFACTURE

CROSS-REFERENCE TO RELATED APPLICATIONS

This application is a divisional of prior U.S. application Ser. No. 14/453,902, filed Aug. 7, 2014, now U.S. Pat. No. 9,093,436 which is a continuation of prior U.S. application Ser. No. 13/537,392, filed Jun. 29, 2012, now U.S. Pat. No. 8,841,758. The entire disclosures of U.S. application Ser. No. 13/537,392 and U.S. application Ser. No. 14/453,902 are hereby incorporated by reference herein.

BACKGROUND

This invention relates generally to semiconductor device packages, and more specifically to leads of flat-pack no-lead semiconductor device packages.

RELATED ART

A semiconductor device may be mounted on a lead frame and encapsulated in a semiconductor device package (hereinafter "package"). A package utilizes leads for externally providing and receiving signals and power. One type of package is a flat-pack no-lead package where the leads are exposed at a bottom and at a side of the package.

A lead frame strip (hereinafter "strip") is populated with multiple lead frames. An encapsulating mold compound and portions of the strip between lead frames are cut during singulation of the strip to create individual packages.

One type of wettable flank of a lead of a flat-pack no-lead package includes a cavity, or recess, on the end of the lead, which has been plated, such as with matte tin, nickel palladium gold or palladium, so that solder can wet to the recess. Flat-pack no-lead packages with wettable flanks have better solder fillet formation and allow for easier visual inspection of a solder joint after surface mounting of the package on a printed circuit board (hereinafter "PCB"). After singulation, a recess of a wettable flank appears as a volume of metal missing from a central area of a bottom, external corner of a lead. A recess is narrower than a lead so as to prevent the mold compound from filling the recess. The wettable flank produces a wettable surface that is higher than a bottom of the package. A fillet is an extension of the solder joint at a side of a package that can be visually inspected. The wettable flank facilitates formation of a fillet. Surface tension causes the solder to wet up into the recess of the wettable flank, and the solder may advantageously form a fillet.

Typically, two recesses are formed from a depression in a strip. The process of forming a depression is part of a process of forming the lead frames of a strip and is typically done by a lead frame manufacturer. The depression can be created by a partial-etch, or half-etch, process during manufacture of the lead frames. One known depression is shaped as an elongated slot on a bottom surface of a lead of one lead frame and on a bottom surface of a lead of an adjacent lead frame and on a bottom surface of an intermediate portion of the strip between the adjacent lead frames.

Saw singulation cuts through portions of the strip between lead frames. The cutting process removes, as swarf, much of the intermediate portion of the strip including a middle portion of the depression. End portions of the depression, which remain after saw singulation, become the recesses of the wettable flanks. Most leads are copper. During saw singulation, copper may, due to a ductile nature of copper, disadvantageously fill a portion of the depression that becomes (after singulation) the recess of a wettable flank. The copper may peel when a blade of a saw arrives at an edge of a depression and copper debris may adhere to the edge of the depression. As a result, the copper debris may reduce at least one of the dimensions of the recess. Such reduction in the at least one dimension of the recess is most apparent when the recess was small prior to saw singulation. The lead frame is unsupported at the depression, and, as a result, when the strip is saw singulated, burrs or tear-outs of copper may form, and the depression may capture other saw debris, such as epoxy, from the mold compound. Such copper and other saw debris in the recess of a wettable flank can result in a visual rejection of a package. Also, such copper and other saw debris in the recess of a wettable flank can result in an increased risk of a defect in a solder joint formed during surface mounting of the package to a PCB because such debris may detrimentally affect solder joint formation. Additionally, the debris may fall out of the recess and on to the PCB.

When the pitch is less than 1 mm, one known method to avoid the debris that may form in recesses of wettable flanks during saw singulation is to punch singulate, rather than to saw singulate, flat-pack no-lead packages. However, punch singulation is disadvantageous because a number of individual units on a strip when a strip is to be punch singulated cannot be as large as a number of individual units on a strip when the strip is to be saw singulated.

Another known method reduces a rate of sawing and/or uses specialized blades in an attempt to reduce accumulation and retention of debris in recesses; however, such known methods do not eliminate accumulation and retention of debris in recesses.

Another known method uses a structure that includes a through hole opening in a lead, and then fills the through hole opening with solder prior to singulation.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 15 is a perspective view of an enlargement of an encircled region shown in FIG. 14 showing one debris-free recess in accordance with the invention.

FIG. 16 is a perspective view of an enlargement of a prior art recess showing debris in the prior art recess.

FIG. 17 is a partial, side-elevational view illustration the manner in which a prior art package that includes the prior art recess of FIG. 16 is mounted to a PCB and shows how formation of a fillet is adversely affected by debris in the prior art recess.

DETAILED DESCRIPTION

Figure 1:
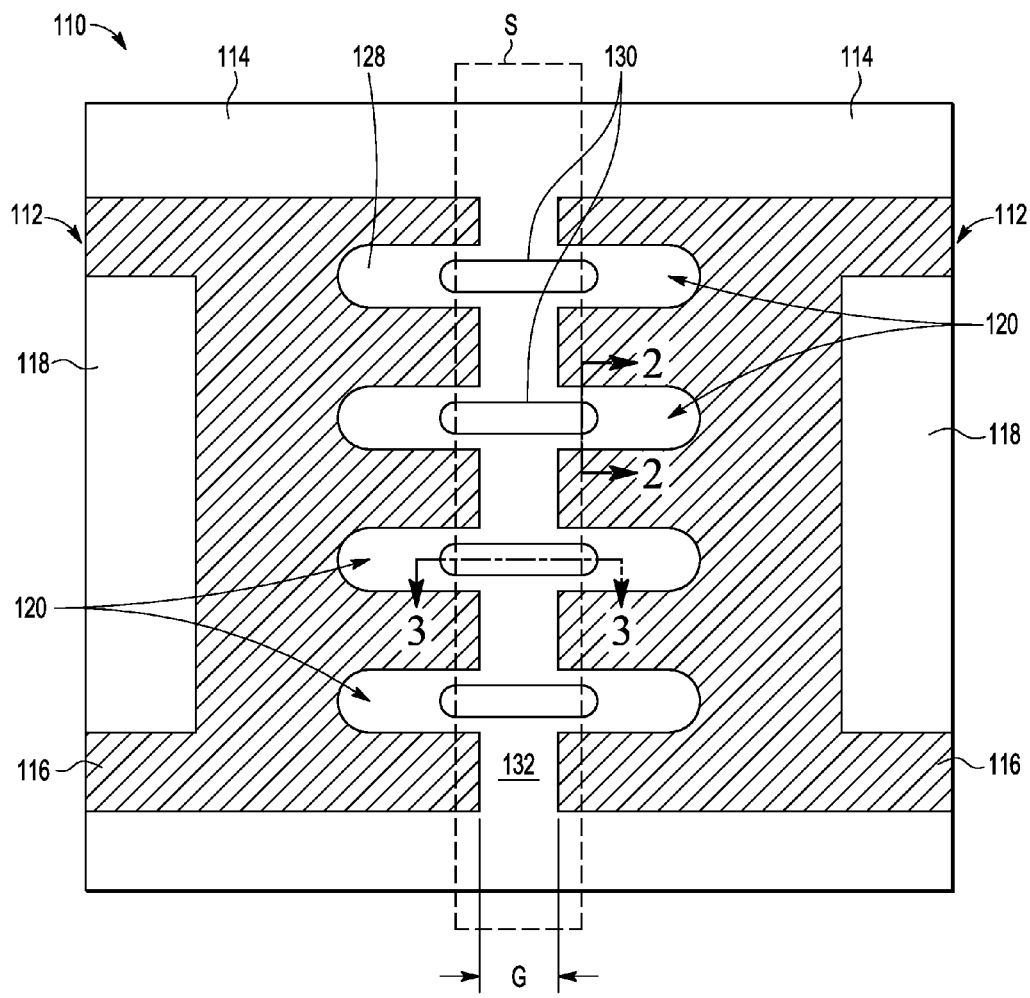
FIG. 1 is a bottom plan view of a portion of a strip including portions of two lead frames, showing depressions in the lead frames.

FIG. 1 is a bottom plan view of a portion of a dual, flat-pack no-lead type strip 110 including portions of two adjacent lead frames 112, showing depressions 130 in each lead frame 112. Filling the depressions 130 in each lead frame with an appropriate material prior to saw singulation prevents formation and accumulation of debris within recesses of wettable flanks of the leads of each flat-pack no-lead package produced from the strip 110, thereby facilitating saw singulation and/or allowing a wider process window for saw singulation. The methods in accordance with the invention prevent accumulation of debris in the recesses during assembly of QFN-style packages. Performing saw singulation when material is in the depressions 130 prevents the formation of copper burrs in the recesses.

Figure 2:
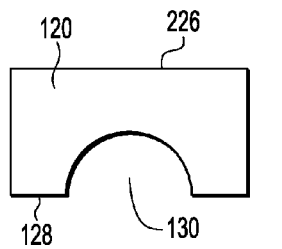
FIG. 2 is a cross-sectional taken along line 2-2 of FIG. 1.

FIG. 2 is a cross-sectional taken along line 2-2 of the strip 110. Each lead 120 has a bottom surface 128 and a top surface 226.

Figure 3:
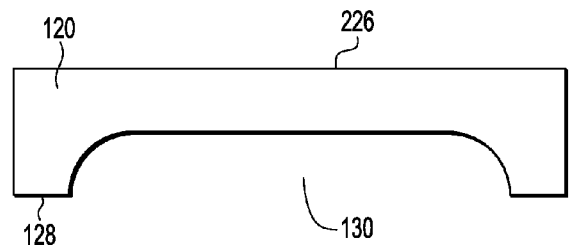
FIG. 3 is a cross-sectional taken along line 3-3 of FIG. 1.

FIG. 3 is a cross-sectional taken along line 3-3 of the strip 110.

Figure 4:
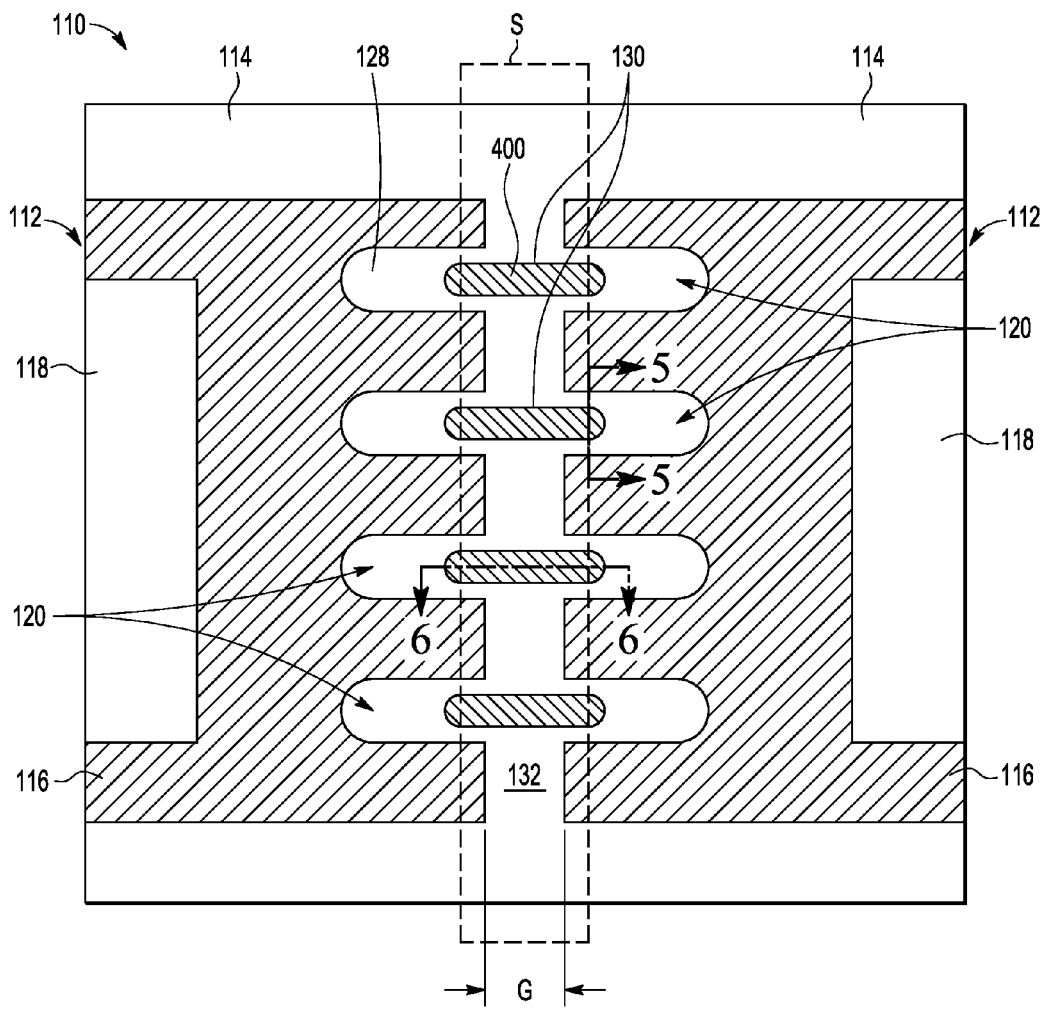
FIG. 4 is a bottom plan view of a portion of the strip of FIG. 1 after material has been placed into depressions in accordance with various embodiments of the invention.

FIG. 4 is a bottom plan view of the portion of the strip 110 with a material 400 disposed in the depressions 130.

Figure 5:
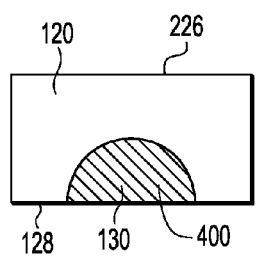
FIG. 5 is a cross-sectional taken along cut-line 5-5 of FIG. 4 showing a cross-section of a depression with the material in the depression.

FIG. 5 is a cross-sectional taken along cut-line 5-5 of the strip 110 showing a cross-section of a depression 130 with the material 400 in the depression.

Figure 6:
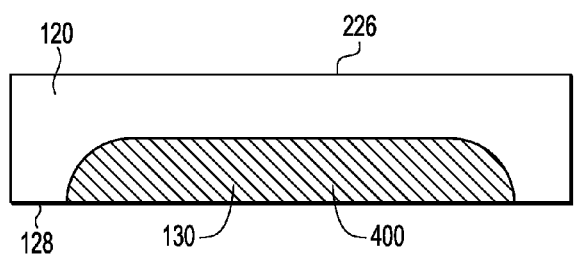
FIG. 6 is a cross-sectional taken along cut-line 6-6 of FIG. 4 showing a cross-section of a depression with the material in the depression.

FIG. 6 is a cross-sectional taken along cut-line 6-6 of the strip 110 showing a cross-section of a depression 130 with the material 400 in the depression. The material 400 is represented by cross hatching in the depressions 130 of FIGS. 4, 5 and 6. As explained more fully hereinbelow, the material 400 is one of a solder wettable material (hereinafter "wettable material") 200 and a removable material 300.

Each lead frame 112 of the strip 110 includes an outer frame structure 114 that surrounds a centrally positioned opening 116 into which the mold compound, shown diagonally hatched, penetrates during encapsulation. The lead frame 112 may include a die pad 118 disposed within the opening 116. The successive lead frames 112 of the strip 110 may extend in a two dimensional matrix presenting rows and columns of lead frames. Each lead frame 112 further comprises sets of leads 120 disposed side by side at intervals along respective sides of each lead frame 112 and separated from adjacent lead frames by a gap G.

Before encapsulation, semiconductor dies (not shown) are mounted on and attached to respective lead frames 112. Electrical connections are made between bonding pads (not shown) on the die and respective ones of the leads 120 using wires. The lead frames 112 are then encapsulated by applying the mold compound to the strip 110, either to the entire strip, or to form individual moldings for individual packages.

Before singulation, as shown in FIGS. 1 and 4, the leads 120 are integrally connected to, and supported by, the outer frame structure 114 and extend inward into the opening 116 toward the peripheral edge of the die pad 118. In each strip 110, the outer frame structure 114 includes an intermediate common bar 132, which are common to adjacent lead frames 112. The outer frame structure 114, including the common bar 132, is cut away and discarded during singulation.

As shown in FIGS. 1 and 4, the depressions 130 of the leads 120 of adjacent lead frames 112 within the same column or row, may be formed by semi-etching or partial-etching, which is etching the material of the strip 110 part-way through its thickness. The partial-etching forms partially-etched, elongated depressions 130 extending across the common bar 132 of the outer frame structure 114 common to adjacent lead frames, so that the opposite end portions of the depressions 130 later form (after singulation) recesses 134 at the ends of the juxtaposed leads 120 of the adjacent lead frames.

A saw street S of the strip 110 extends along the common bar 132. The passage of a saw blade along each saw street S separates the adjacent lead frames 112 from each other. Orthogonal row and column saw streets S extend within a two-dimensional strip 110. A width of a blade used in the saw singulation process is such that the saw street S does not include the opposed end portions of each depression 130.

Typically, the saw blade is the same width as each of the saw streets S and straddles the common bar 132 of the outer frame structure 114 while it is sawing. Thus, during the saw singulation process, the saw blade cuts along each saw street S longitudinally, cutting into and along the common bar 132 of each outer frame structure 114, which reduces all the metal material of the common bar 132 to swarf, which is discarded, and further removes or severs a portion of each of the leads 120 to form their outer ends at the peripheral edge surfaces of the package 140, in addition to cutting the mold compound. The saw singulation process also cuts away the middle portion of depressions 130.

Figure 7:
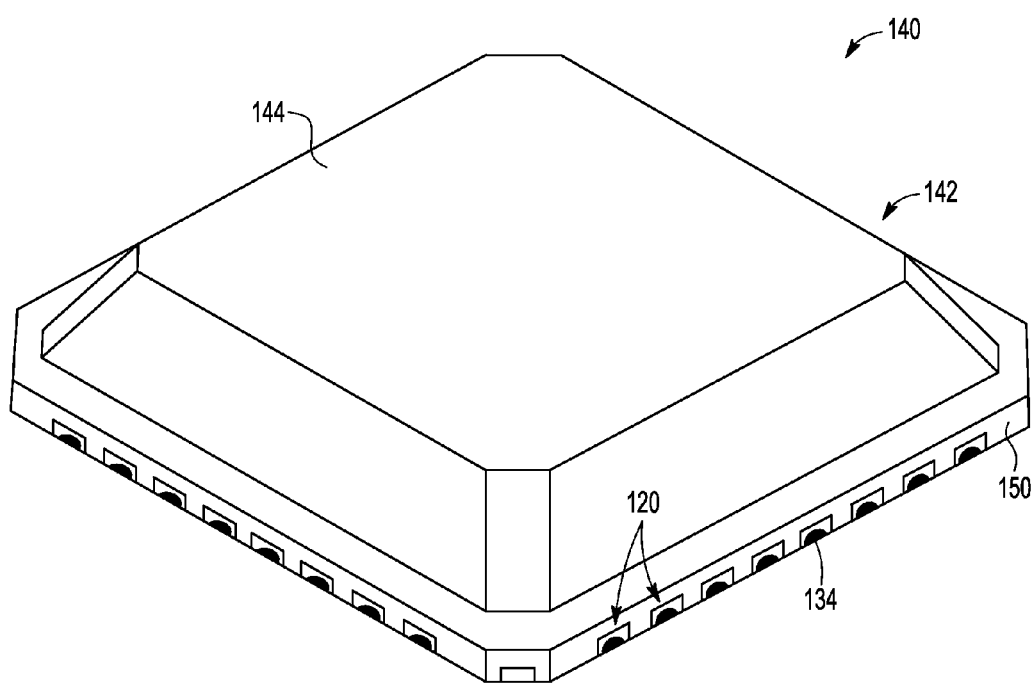
FIG. 7 is a top isometric view of a package produced from a strip similar to the strip of FIG. 1 when the material in the depressions is a wettable material that is present in depressions during singulation and remains in a recess at an external corner of each lead after singulation, and showing the wettable material in the recess of the external corner of each lead, in accordance with various embodiments of the invention.

FIG. 7 is a top isometric view of a completed quad, flat-pack no-lead package 140 when the material 400 in the partially-etched depressions 130 is the wettable material 200, which was present in the partially-etched depressions during singulation. The package 140 illustrated in FIG. 7 was manufactured, or assembled, utilizing a first method (see FIG. 18) in accordance with one embodiment of the invention. FIG. 7 shows the wettable material 200 in the recess of the external corner of each lead 120 of the package 140.

Figure 8:
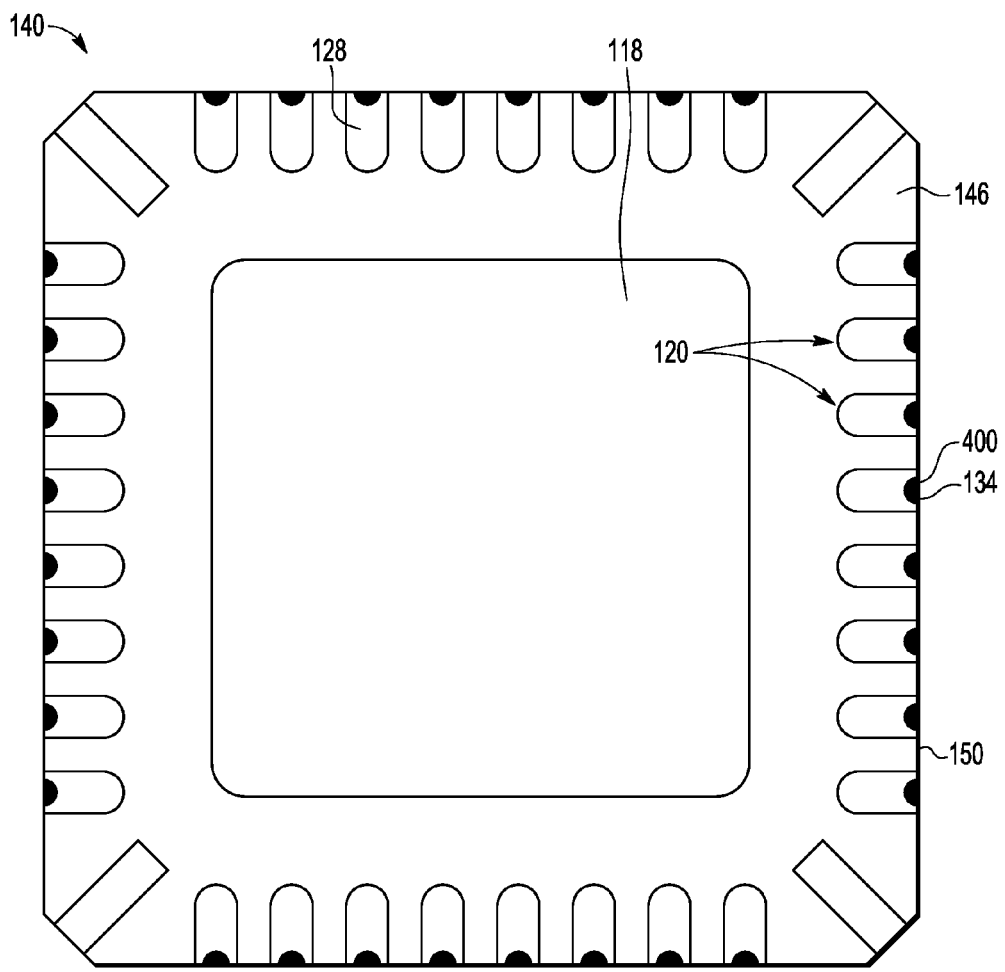
FIG. 8 is a bottom plan view of the semiconductor package of FIG. 7.

FIG. 8 is a bottom plan view of the package 140. The wettable material 200 is represented as a small solid dark area in each recess of FIGS. 7 and 8.

Figure 9:
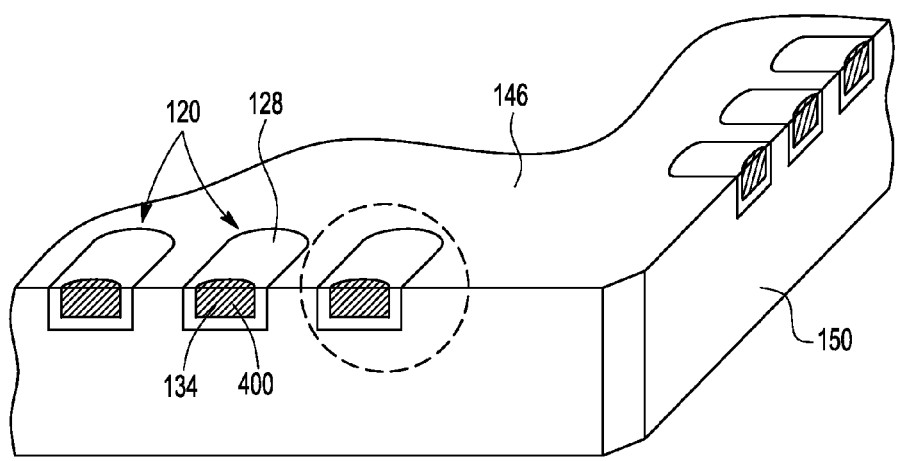
FIG. 9 is a perspective view of an enlargement of an encircled region shown in FIG. 8 showing several recesses and showing the wettable material in the recesses.

FIG. 9 is a perspective view of an enlargement of an encircled region shown in FIG. 8 showing several recesses 134 and showing the wettable material 200 in the recesses as cross-hatching.

Figure 10:
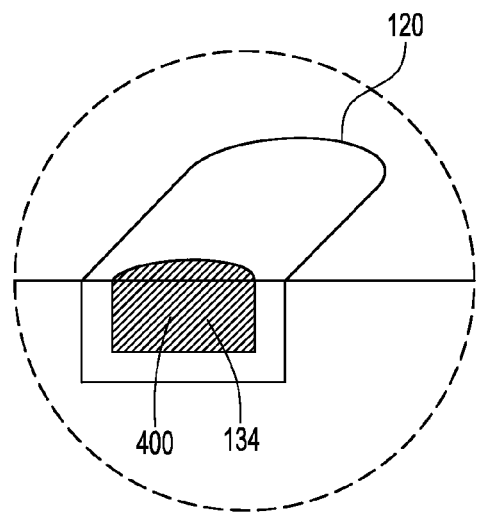
FIG. 10 is a perspective view of an enlargement of an encircled region shown in FIG. 9 showing one recess and showing the wettable material in the recess.

FIG. 10 is a perspective view of an enlargement of an encircled region shown in FIG. 9 showing one recess 134 and showing the wettable material 200 in the recess as cross-hatching.

The package 140 includes a package body (hereinafter "body") 142 formed by the hardening of electrically insulating plastic encapsulation material, or mold compound, which is applied to a strip such as the strip 110. Each package 140 comprises sets of discrete, electrical contact elements or leads 120 disposed side by side at intervals along respective sides of the bottom face 146 of the package and extending perpendicularly to the side of the corresponding bottom face 146. In package 140, sets of leads 120 are disposed on all four sides of the bottom face 146 and are exposed at the bottom face 146 and at the side edges 150 of the package for soldering to the electrical connections of the support. In a dual no-lead package (not shown), sets of leads 120 are disposed on only two opposed sides of the bottom face 146. As shown in FIGS. 7-10, the ends of the leads 120 of the package 140 terminate approximately flush with the sides of the singulated, completed package.

The saw singulation process separates the packages 140 from each other by cutting and separating both the individual lead frames 112 of the strip 110 and the plastic encapsulation material in a manner completing the formation of the body 142 of each package 140. The completely formed package 140 defines a top face 144 and an opposing bottom face 146, which are generally rectangular. A side edge 150 extends transversely to the top face 144 and bottom face 146 of the body 142.

The leads are exposed within the bottom face 146 of the body 142. The outer ends of the leads 120 are exposed within the side edges 150 of the body 142. The leads have recesses 134 formed at a corner of each lead 120 formed by the bottom surface 128 of each lead and the exposed outer end of each lead 120 of a package 140. The bottom surface 128 of each lead near this corner functions as an electrical contact portion of each lead. Completion of the saw singulation process results in a recess 134 being formed within each lead 120. Each recess 134 is formed in a corner region of the corresponding lead 120 defined by an outer end and the bottom surface 128 thereof. The recess 134 is disposed within the bottom surface 128 and the outer end, but does not extend to the top surface 226 or either of the side surfaces. Each recess 134 has a generally concave configuration. During solder mounting of the package 140 on a PCB 152 (see FIG. 11), solder can reflow up into the recesses 134. The electrical contact surface portions and outer end, including the recesses 134, of each lead 120 (which are exposed outside of the body 142) may have a plating layer applied to facilitate soldering to the PCB 152.

The methods in accordance with the invention overcome the problem of burrs and debris collecting in the recess 134 during saw singulation of packages 140. The methods in accordance with the invention fill depressions 130 with either the wettable material 200 or with the removable material 300. The removable material 300 does not compromise the wettability of the lead 120 or of the recess 134. The removable material 300 has one of rigid and semi-rigid properties when singulation is performed; however, the removable material may be fluidic when it is placed in the depressions 130. A depression 130 that is at least partially filled with material 400 at time of singulation eliminates (or at least effectively eliminates) debris that would otherwise accumulate in the recesses 134 as a result of singulation, especially saw singulation. Much of the debris that accumulates in the recesses 134 as a result of using known methods of singulation may disadvantageously remain in the recesses indefinitely. The methods in accordance with the invention improve the ability to produce a debris-free recess 134 in packages 140 with fine pitch leads 120 by preventing accumulation of debris in the recess during assembly of the package. The methods in accordance with the invention increases a likelihood of forming an inspectable solder joint after mounting on the PCB 152. The methods in accordance with the invention fill the depression 130 with a material 400 that is solid enough to prevent formation of burrs, or tear-outs, during, and as a result of, saw singulation.

A first method in accordance with the invention fills the depressions 130 prior to singulation with the wettable material 200, which prevents formation and accumulation of burrs and debris during singulation, and does not require removal. With the first method, the depression 130 is at least partially filled with the wettable material 200 such as solder, which is typically tin alloyed with copper, lead, silver or bismuth. In various embodiments, the wettable material 200 is solder, solder paste, tin, bismuth, indium, gold, silver, another wettable material, or combinations thereof. In one embodiment, the solder is SAC305 or SAC405, where S=tin, A=silver and C=copper. For example, SAC305 is 96.5% tin, 3% silver, and 0.5% copper. The depressions 130 may be filled with the wettable material 200 in several ways. The first method fills the depression 130 with the wettable material 200 by squeegee application, stencil print or screen print to move solder paste into the depressions 130, then reflows the wettable material prior to continuing with normal assembly of the package 140. In another embodiment, a solder jet is used which streams solder paste through a small nozzle to fill the depressions 130. In another embodiment, solder paste that has been atomized into nanoparticles is sprayed into the depressions 130. In another embodiment, solder balls are placed into each depression 130. The solder balls are then melted or reflowed to fill the depressions 130. In another embodiment, the strip 110 is masked such that only the depressions 130 are exposed, wherein the wettable material 200 is formed in the openings of a mask. In another embodiment, the strip 110 is plated with the wettable material 200 until the depressions 130 become filled. In some embodiments of the first method, the wettable material 200 that is placed in the depressions 130 is then heated to reflow the wettable material. In each embodiment of the first method, the strip 110 is singulated after the wettable material 200 is placed in the depressions 130. In each embodiment of the first method, the wettable material 200 is not removed after it is placed in the depressions 130. Maintaining the wettable material 200 in the depression 130 after singulation prevents any further accumulation of debris in the recess 134 after singulation.

A second method in accordance with the invention fills the depression 130 prior to singulation with a removable material 300 that can be hard enough to prevent the burrs and debris from collecting in the recess 134, and that is easily removable using water or other chemistry common to semiconductor processing (such as photo resist). In one embodiment, the removable material 300 one of a hot-water soluble adhesive, a hot-water soluble thermoplastic material and a hot-water soluble thermosetting polymer material. The hot-water soluble material is applied at a high enough temperature (about 100° C.) for the material to be in a liquid form. The hot-water soluble material is adequately solid when cured, but, after it has cured, it rinses cleanly away in hot water. An example of such a hot-water soluble material that can be used is AquaBond® ABS-65 (AquaBond is a trademark of AquaBond Technologies, Inc., of Camarillo, Calif.). In one embodiment, the strip 110 is put into in a bath of the hot-water soluble material at a high enough temperature (about 100° C.) for the material to be in a liquid form. In another embodiment, the hot-water soluble material is heated to a high enough temperature (about 100° C.) for the material to be in a liquid form, and it is applied to the strip 110 by screen printing using a stencil. Then, the hot-water soluble removable material 300 on the strip 110 is allowed to return to room temperature, and the hot-water soluble removable material hardens or solidifies, and it becomes at least semi-rigid. The recesses 134 remain filled with the hot-water soluble removable material 300 during singulation, which prevents debris from entering the recess 134 during the saw singulation process. Next, the partially singulated strip or the individual units are put into a hot-water bath to remove the hot-water soluble removable material 300 from the recess 134. An exposed debris-free recess 134 results. In one embodiment, the partially singulated strip or the individual units are immersed in hot water or sprayed with hot water (at about 80-90° C.) until the hot-water soluble removable material 300 dissolves.

The application of the hot-water soluble removable material 300 to the strip 110 is a last step prior to singulation. The immersion of the partially singulated strip or the individual units in hot water, or the spraying the partially singulated strip or the individual units with hot water is a first step after saw singulation.

In another embodiment, the removable material 300 is a polyvinylpyrrolidone polymer, which is a hot-water soluble thermosetting polymer material that is cured using ultraviolet (UV) light. An example of such a polyvinylpyrrolidone polymer is Dymax® UV Curable Water Soluble Masks 9-20553 Series (Dymax is a trademark of Dymax Corporation of Torrington, Conn.). After the polyvinylpyrrolidone polymer is cured, the strip 110 is singulated. In one embodiment, the strip 110 is partially sawn, thereby producing a partially singulated strip. In another embodiment the strip 110 is sawn through completely, thereby singulating the strip into individual units. After singulation, the partially singulated strip or the individual units are immersed in hot water or sprayed with hot water (at about 120-150° F.) until the polyvinylpyrrolidone polymer dissolves, thereby removing the polyvinylpyrrolidone polymer from the recess 134, and revealing a debris-free recess.

In another method in accordance with the invention, the removable material 300 is polyimide, and the polyimide is removed, using acetone, after singulation, and revealing a recess 134 that is debris-free.

In various other embodiments, the removable material 300 is another type of polymer, a polymer adhesive, or a photo-resist material, which is then removed after singulation, and revealing a recess 134 that is debris-free.

In one embodiment, a partial saw procedure is performed on the strip 110 after depositing the removable material 300 to allow for removal of the removable material 300 while the strip is still in strip form. In such one embodiment, the strip 110 is partially sawn, which means sawn entirely through the metal lead frame 112 including through the removable material 300, but not sawn through the mold compound, thereby producing a partially singulated strip. In such one embodiment, the removable material 300 can be removed from the depressions 130 of the partially singulated strip without debris remaining in the recesses 134 because the metal lead frame 112 has already been cut through and because a primary cause for debris is from cutting of the metal lead frame. The partial saw procedure may use a blade that is slightly wider than a blade used for a through cut to ensure that the metal lead 120 is not accidently "clipped" when full singulation is completed after removing the removable material 300. In another embodiment the strip 110 is sawn through completely, thereby singulating the strip into fully singulated individual units.

In each embodiment of the second method, the strip 110 is singulated or partially singulated after the removable material 300 is placed in the depressions 130 and only while the removable material is in the depressions. In each embodiment of the second method, after the strip 110 is singulated or partially singulated, the removable material 300 is removed.

Figure 11:
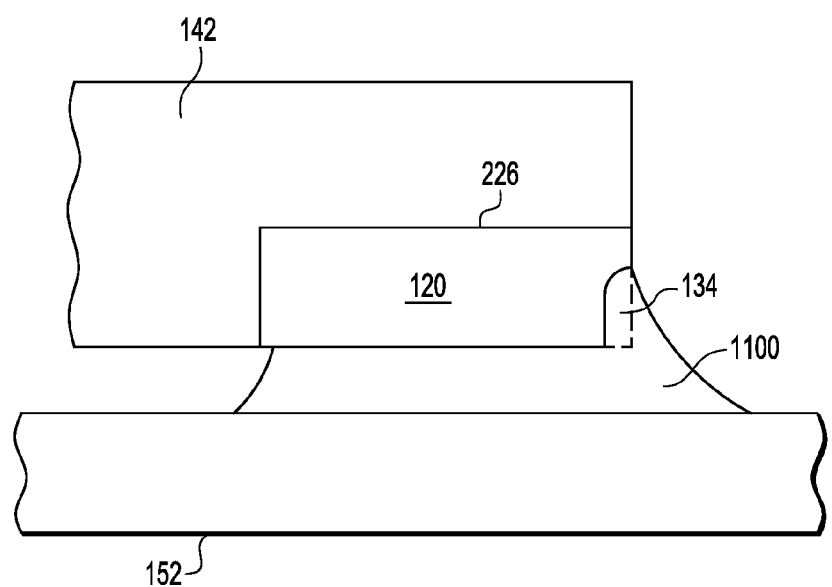
FIG. 11 is a partial, side-elevational view illustrating the manner in which the package of FIGS. 7-10 is mounted to a PCB, and showing a fillet.

FIG. 11 is a partial, side-elevational view illustrating the manner in which the package 140 assembled in accordance with one of various embodiments of the invention, is mounted to the PCB 152, and showing a solder fillet 1100. The methods (see FIGS. 18 and 19) and the package 140 produced thereby in accordance with various embodiments of the invention aid in the formation of a well-formed solder fillet that can be easily inspected visually.

Figure 12:
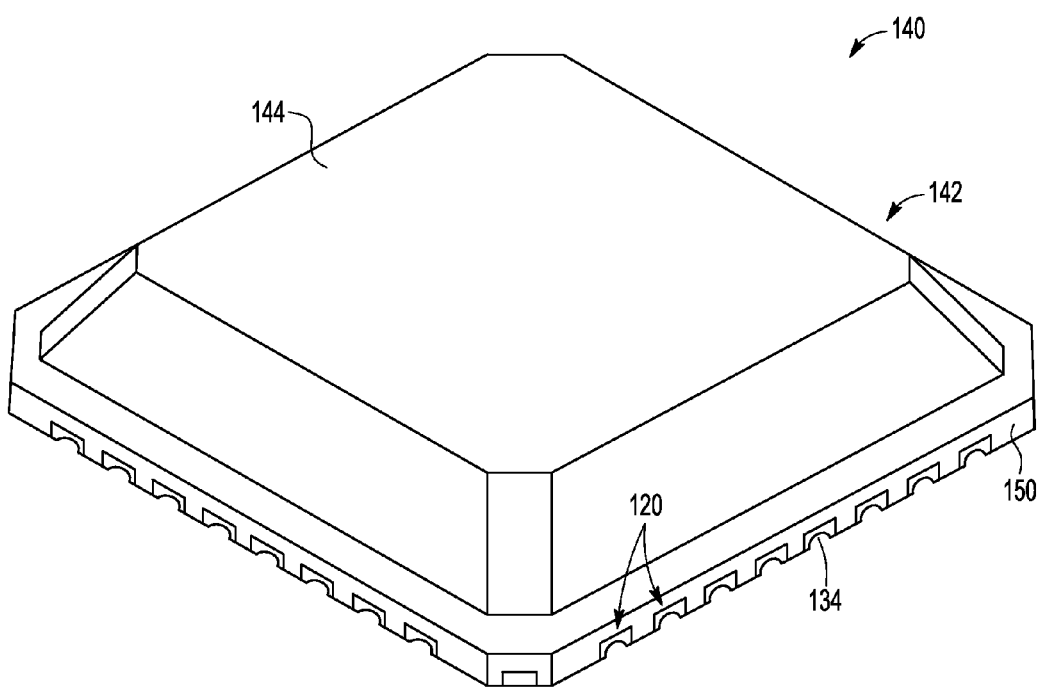
FIG. 12 is a top isometric view of a package produced from a strip similar to the strip of FIG. 1 when the material in the depressions is a removable material that is present in the depressions during singulation and is removed after singulation, and showing a debris-free recess at an external corner of each lead after the removable material is removed, in accordance with various embodiments of the invention.

FIG. 12 is a top isometric view of a quad, flat-pack no-lead package 140 that was manufactured, or assembled, utilizing the second method (see FIG. 19) in accordance with the invention, in which a strip similar to strip 110 was singulated while the removable material 300 was disposed in the depressions 130. The removable material 300 was removed after singulation, and, as illustrated in FIG. 12, there is a debris-free recess 134 at an external corner of each lead 120.

Figure 13:
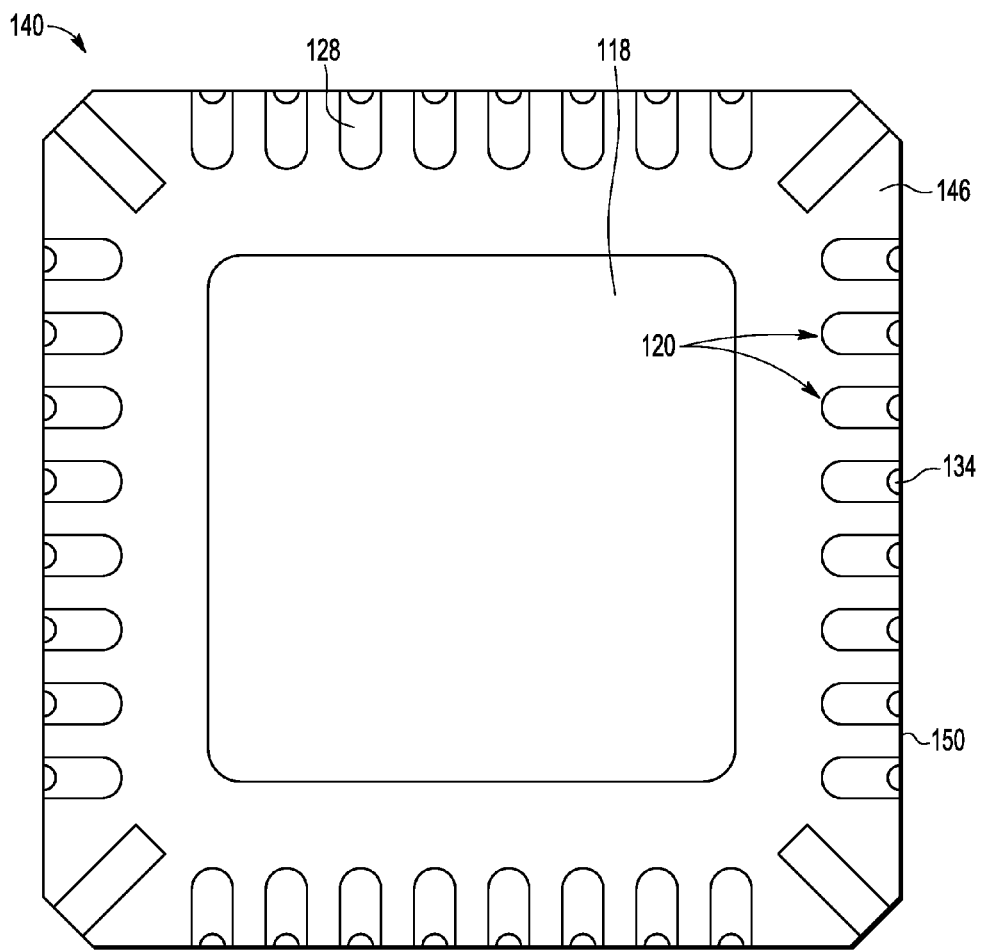
FIG. 13 is a bottom plan view of the package of FIG. 12.

FIG. 13 is a bottom plan view of the package 140.

Figure 14:
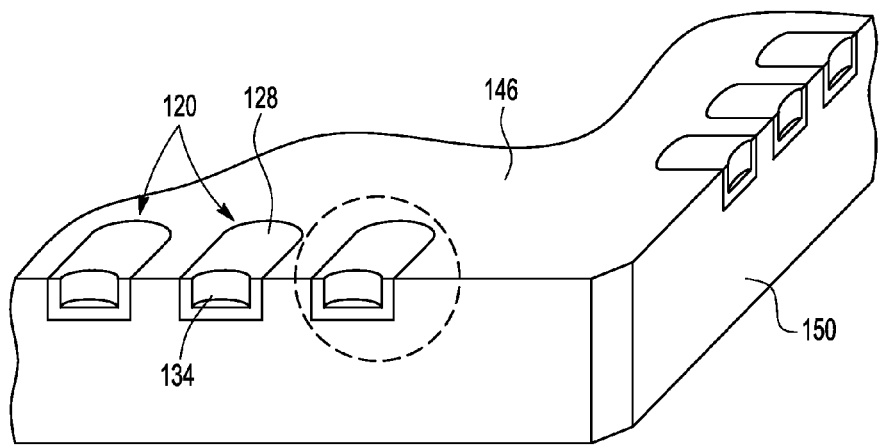
FIG. 14 is a perspective view of an enlargement of an encircled region shown in FIG. 13 showing several debris-free recesses in accordance with the invention.

FIG. 14 is a perspective view of an enlargement of an encircled region shown in FIG. 13 showing several debris-free recesses 134 in accordance with the invention.

FIG. 15 is a perspective view of an enlargement an encircled region shown in FIG. 14 showing one debris-free recess 134 in accordance with the invention. The second method (see FIG. 19), and the package 140 produced thereby, results in the debris-free recess 134 shown in FIG. 15.

FIG. 16 is a perspective view of an enlargement of a prior art recess 1634 showing debris 1635 in the prior art recess.

FIG. 17 is a partial, side-elevational view illustration the manner in which a prior art semiconductor package, which includes a prior art body 1742 and the prior art recess 1634 in a prior art lead 1620, is mounted to a PCB 1752, and shows how formation of a prior art solder fillet 1700 is adversely affected by the debris 1635 in the prior art recess.

Figure 18:
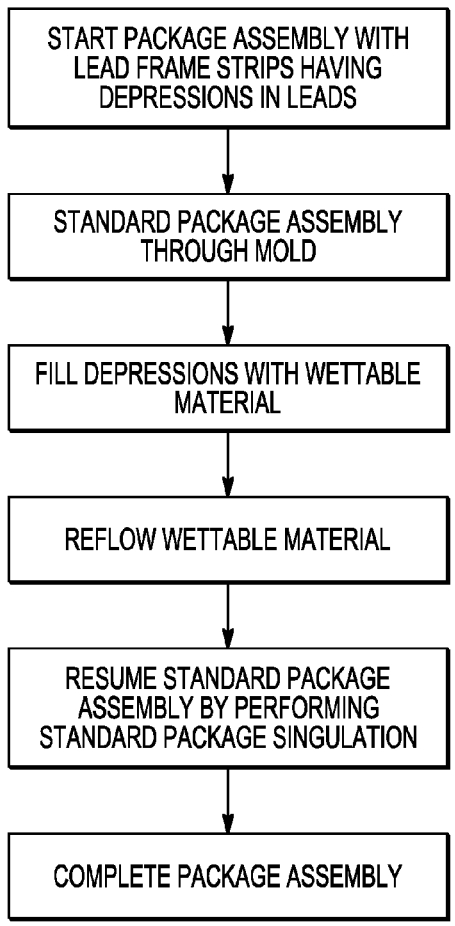
FIG. 18 is a flow diagram of a method of assembling a flat-pack no-lead package in accordance with one embodiment of the invention.

FIG. 18 is a flow diagram of a first method of assembling the package 140 in accordance with an embodiment of the invention that utilizes the wettable material 200. The first method starts with a standard strip 110 that has standard depressions 130 in the lead frames 112, which depressions are used for creating recesses 134 after singulation. The first method performs standard package assembly up to and including a step of encapsulation of the strip 110 with mold compound. Next, the depressions 130 are filled with the wettable material 200. Next, the strip 110 is heated so that wettable material 200 reflows, and then, the strip is allowed to cool to room temperature. Next, the strip 110 is singulated. Advantageously, the strip 110 is singulated in a standard way with saw standard blades and techniques, notwithstanding the presence of the wettable material 200 in the depressions 130. Next, normal assembly is resumed. An end of the first method results in complete package assembly with solder in the recesses 134 of a completed package 140.

Figure 19:
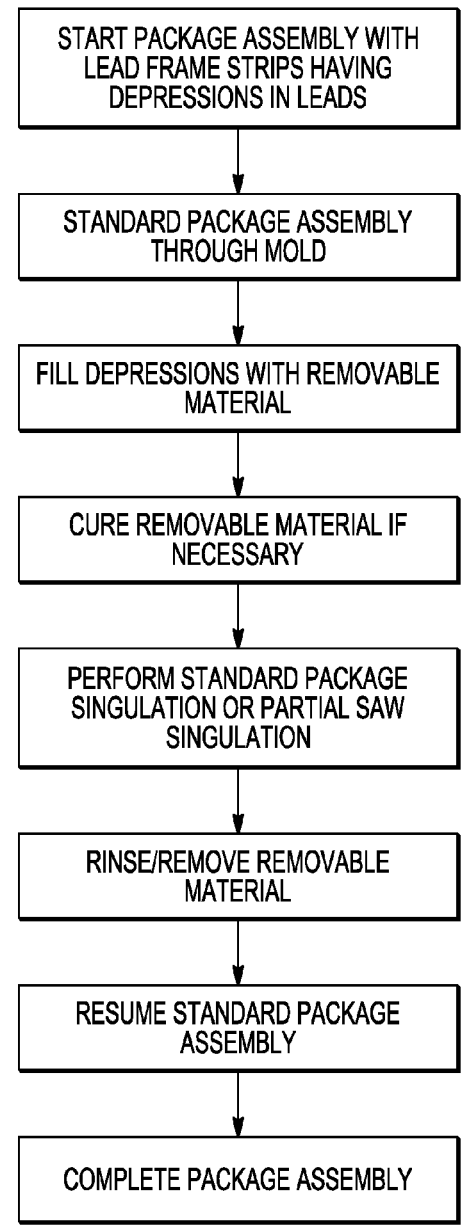
FIG. 19 is a flow diagram of a method of assembling a flat-pack no-lead package in accordance with another embodiment of the invention.

FIG. 19 is a flow diagram of a second method of assembling the package 140 in accordance with an embodiment of the invention that utilizes the removable material 300. The second method starts with a standard strip 110 that has standard depressions 130 in the lead frames 112, which depressions are used for creating recesses 134 after singulation. The second method performs standard package assembly up to and including a step of encapsulation of the strip 110 with mold compound. Next, the depressions 130 are filled with the removable material 300 such as by dipping the strip 110 into in a tank or reservoir of the removable material, or by curtain coating the strip with the removable material, or by stencil printing. Next, the removable material 300 is cured per recommendation of manufacturer of the removable material to make the removable material hard and/or stiff. Next, the strip 110 is singulated using standard singulation techniques, or partial saw singulation is performed on the strip. Advantageously, the strip 110 is singulated in a standard way with saw standard blades and techniques, notwithstanding the presence of the cured removable material 300 in the depressions 130. Next, the removable material 300 is rinsed or removed from the singulated lead frames 112. Next, normal assembly is resumed. An end of the second method results in a completed package 140 having debris-free recesses 134.

In some embodiments, the depressions 130 are filled with the material 400 after the strip 110 is molded because at this stage, there is very little likelihood of contaminating other portions of the after the strip is molded. By moving wettable material 200 into the depressions 130 after the strip 110 is molded, there is little chance of the wettable material running down inside the lead frames 112 and contaminating wire bonds, die surfaces or die flag attach areas because they are already protected by the molding process. In other embodiments, the depressions 130 are filled at any stage of assembly prior to singulation.

It has been determined by experimentation that the lead frames 112 can be saw singulated cleanly by proper management of blade loading without melting the material 400 that is disposed within the depressions 130.

Figure 20:
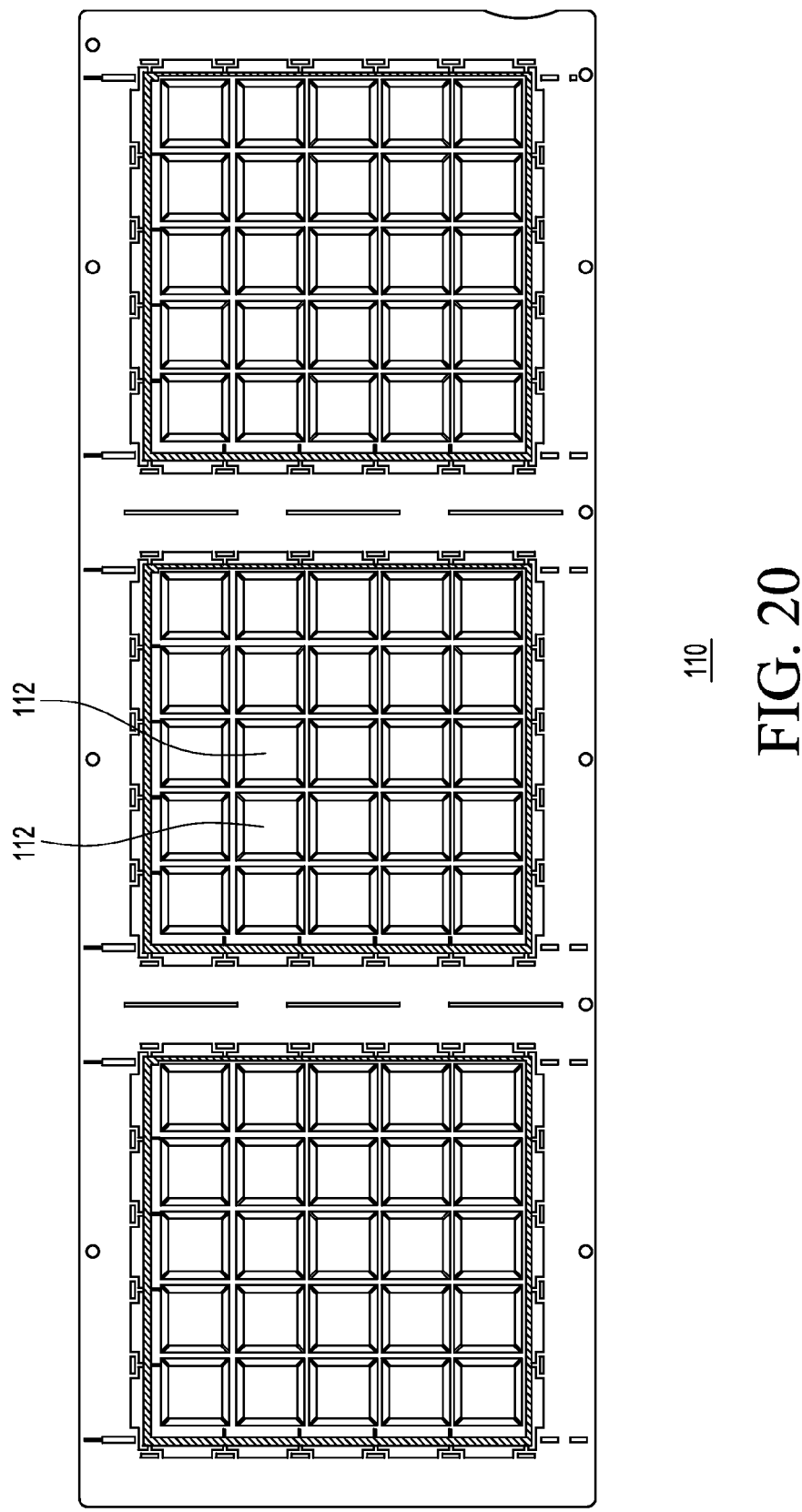
FIG. 20 is plan view of a strip, given by way of example, which may be used in one or more methods of assembling packages in accordance with various embodiments of the invention.

FIG. 20 is an illustration of one example of a strip such as strip 110, which may be used in one or more methods of assembling packages 140 in accordance with various embodiments of the invention. The strip illustrated in FIG. 20 includes three arrays of lead frames, each array including twenty-five lead frames such as lead frame 112, for a total of seventy-five lead frames.

In one embodiment, the package 140 is a quad, flat-pack no-lead (QFN) package (hereinafter "QFN-style package").

Examples of QFN-style packages are: a power quad flat-pack no-lead (PQFN) package, an extremely-thin quad flat-pack no-lead (XQFN) package, a depopulated very-thin quad flat-pack no-lead (DQFN) package, and a heatsink very-thin quad flat-pack no-lead (HVQFN) package. QFN-style packages may also include other types of flat-pack no-lead packages. In another embodiment, the package 140 is a dual flat-pack no-lead (DFN) package.

Although a person of skill in the art will note that FIGS. 1 and 4 illustrate a strip used in assembling a dual flat-pack no-lead type package, and that FIGS. 7-9 and 12-14 illustrate a quad flat-pack no-lead type package, for ease of description, these will be treated as showing a same product, because the method in accordance with the present invention is applicable equally to both quad and dual flat-pack no-lead type packages.

The specification and figures are to be regarded in an illustrative rather than a restrictive sense, and all such modifications are intended to be included within the scope of the present invention. Any benefits, advantages or solutions to problems described herein with regard to specific embodiments are not intended to be construed as a critical, required or essential feature or element of any or all the claims. Unless stated otherwise, terms such as "first" and "second" are used to arbitrarily distinguish between the elements such terms describe. Thus, these terms are not necessarily intended to indicate temporal or other prioritization of such elements. Note that the term "couple" has been used to denote that one or more additional elements may be interposed between two elements that are coupled.

The Detailed Description section, and not the Abstract section, is intended to be used to interpret the claims. The Abstract section may set forth one or more but not all embodiments of the invention, and the Abstract section is not intended to limit the invention or the claims in any way.

Although the invention is described herein with reference to specific embodiments, various modifications and changes can be made without departing from the scope of the present invention as set forth in the claims below.

What is claimed is:

1. A lead frame strip including a plurality of lead frames, comprising:
   at least one elongated depression in a bottom surface of the lead frame strip, the at least one depression sized such that it does not cause an opening to occur between the bottom surface and a top surface of the lead frame strip, wherein the at least one elongated depression extends from a lead of a first lead frame to a lead of a second lead frame adjacent to the first lead frame and includes a portion of the lead frame strip between said lead frames; and
   a material other than a solder wettable material disposed in the at least one elongated depression,
   wherein the at least one elongated depression becomes, after singulation of the lead frame strip into individual lead frames, a recess at a corner of an end of a lead of at least one of the first lead frame and the second lead frame.

2. The lead frame strip of claim 1, in which the material is a material from a group consisting of: an adhesive material, a thermoplastic material and a polymer material.

3. The lead frame strip of claim 2, in which the material is the polymer material.

4. The lead frame strip of claim 3, wherein the polymer material is a polyvinylpyrrolidone polymer, and wherein the polyvinylpyrrolidone polymer is one of rigid and at least semi-rigid after it is exposed to ultra-violent light.

5. The lead frame strip of claim 1, wherein the material is soluble in water that is above room temperature.

6. The lead frame strip of claim 5, in which the material is a thermosetting polymer material.

7. The lead frame strip of claim 1, in which the material is polyimide.

8. The lead frame strip of claim 2, wherein the material is fluidic when it is disposed in the at least one elongated depression, and wherein the material becomes one of rigid and at least semi-rigid prior to the singulation of the lead frame strip into individual lead frames.

9. The lead frame strip of claim 8, wherein the material is fluidic when it is at a temperature higher than room temperature.

10. The lead frame strip of claim 8, wherein the material is one of rigid and at least semi-rigid when it is at room temperature.

11. A semiconductor device package, comprising:
   a semiconductor device encapsulated in a package body having a plurality of leads each lead having an exposed portion external to the package; and
   a recess at a corner of at least one of the leads, the recess having a generally concave configuration,
   wherein the recess is filled with a removable material selected from a group consisting of: an adhesive material, a thermoplastic material and a polymer material.

12. The semiconductor device package of claim 11 in which the removable material is the polymer material.

13. The semiconductor device package of claim 12, wherein the polymer material is a polyvinylpyrrolidone polymer, and wherein the polyvinylpyrrolidone polymer is one of rigid and at least semi-rigid after it is exposed to ultra-violent light.

14. The semiconductor device package of claim 11, wherein the removable material is soluble in water that is above room temperature.

15. The semiconductor device package of claim 14, in which the removable material is a thermosetting polymer material.

16. The semiconductor device package of claim 11, wherein the removable material is fluidic when it is disposed in the recess, and thereafter the material becomes one of rigid and semi-rigid.

17. The semiconductor device package of claim 11, wherein the semiconductor device package is a QFN-style package.

18. A lead frame strip, comprising:
   a plurality of lead frames at least one of which includes:
      an outer frame structure defining a central opening;
      a die pad disposed within the central opening; and
      a plurality of leads attached to the outer frame and extending inward toward the die pad in spaced relation to each other,
   wherein each lead of one lead frame extends outward from its die pad and is integral with a lead that extends outward from a die pad of an adjacent lead frame,
   wherein each of the leads includes an elongated partially-etched depression having a middle portion and two end portions, each of the two end portions becoming, after singulation of the lead frame strip into individual lead frames, a recess at a corner of an end of a lead, and
   wherein the elongated partially-etched depression is filled with a non-wettable material prior to singulation.

19. The lead frame strip of claim 18, wherein the non-wettable material is polyimide.

20. The lead frame strip of claim 18, wherein the non-wettable material is a hot-water soluble material.

* * * * *